(12) United States Patent  
Jeon et al.

(10) Patent No.: US 6,897,500 B2  
(45) Date of Patent: May 24, 2005

(54) CMOS IMAGE SENSOR

(75) Inventors: In Gyun Jeon, Seoul (KR); Jinsu Han, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 33 days.

(21) Appl. No.: 10/442,898

(22) Filed: May 21, 2003

(65) Prior Publication Data

US 2004/0061113 A1 Apr. 1, 2004

(30) Foreign Application Priority Data

May 22, 2002 (KR) .................................. 10-2002-0028462

(51) Int. Cl.$^7$ ............................................. H01L 31/062
(52) U.S. Cl. ........................ 257/292; 257/443; 257/655
(58) Field of Search ................................ 257/223, 227, 257/291, 292, 439, 443, 655, 545, 546

(56) References Cited

U.S. PATENT DOCUMENTS 6,040,592 A * 3/2000 McDaniel et al. .......... 257/292

* cited by examiner

*Primary Examiner*—Hoai Pham  
*Assistant Examiner*—Wai-Sing Louie  
(74) *Attorney, Agent, or Firm*—Hanley, Flight & Zimmerman, LLC

(57) ABSTRACT

An example CMOS image sensor has pixel units and protection regions. The pixel unit has a light sensing region for converting an incident light into an electrical signal and an active region for controlling the transfer of the electrical signal. Each pixel unit is isolated by an element isolation layer. The protection region, which is located between each element isolation layer, prevents crosstalk generated between each pixel unit while the incident light is converted to the electrical signal. The protection region may include a well and a junction.

4 Claims, 3 Drawing Sheets

CMOS IMAGE SENSOR

TECHNICAL FIELD

The present disclosure relates to image sensors; and, more particularly, to a complimentary metal-oxide semiconductor (CMOS) image sensor.

BACKGROUND

Every object emanates or reflects its own light and has a different color depending on a wavelength of the emanated or reflected light. Each color of visible light has a different wavelength. For example, red light has a longest wavelength in the visible light, while violet light has a shortest one. Further, the visible light penetrates objects to different depths depending on the wavelength of the visible light. In particular, the object penetration depth of the visible light is in proportion to the wavelength of the visible light.

The above-mentioned characteristics are applied to an image sensor device. A conventional image sensor using a charge coupled device (CCD) has drawbacks such as a complicated fabrication process, a low yield and a high manufacturing cost. In order to solve such problems, a CMOS image sensor manufactured by using a CMOS technology is suggested.

Generally, known CMOS image sensors include a plurality of pixel units having a light sensing region and an active region. Each of the pixel units also includes a light sensing element formed on the light sensing region and a plurality of transistors formed on the active region. The light sensing elements, such as photodiodes, sense incident light reflected from the object and accumulate photoelectric charges that are generated by the incident light. The transistors control the transfer of the photoelectric charges.

One example of a known CMOS image sensor is described below with reference to FIGS. 1 and 2. FIG. 1 shows a plan view illustrating the pixel units of the known CMOS image sensor. In FIG. 1, a pixel unit is referred to as pd-A and pixel units on the upper and lower side of the pixel unit pd-A are referred to as pd-AU and pd-AB, respectively.

As shown in FIG. 1, each pixel unit (pd-A, pd-AU and pd-AB) includes the light sensing element 1 (e.g., photodiode), for converting incident light into electrical signals and the active region 2 for managing or externally transmitting the electrical signals generated in the light sensing element 1. In this configuration, the pixel units (pd-A, pd-AU and pd-AB) are located next to one another.

In an arrangement, such as the arrangement of FIGS. 1 and 2, when the pixel unit pd-A is exposed to incident light, electrical signals generated in the light sensing element 1 of the pd-A affect the pixel units (pd-AU and pd-AB) adjacent thereto. Such a phenomenon is referred to as crosstalk.

The crosstalk also affects the active regions 2 of adjacent pixel units (pd-AU, pd-AB) of the pd-A through right and left adjacent active regions of the light sensing element 1 of pd-A. In this case, the crosstalk can be avoided by controlling voltage applied to the active region 2.

However, because each sensing element 1 of the pd-AU and the pd-AB is adjacent to the sensing element 1 of the pd-A, electrical signals generated of the pd-A affect the pixel units (pd-AU and pd-AB). That is, crosstalk occurs between the adjacent pixel units, and thereby deteriorate characteristics of the pixel units pd-AU and pd-AB.

The problem of the crosstalk is described with reference to FIG. 2, which depicts a cross-sectional view taken along A–A' shown in FIG. 1. In the conventional CMOS image sensor, impurities implanted in the pd-A are diffused through bottom portion of element isolation layer 4, or a depletion layer between pixel units is extended due to a potential difference, electrical signals generated in the pd-A can easily move to neighboring pixel units through the bottom portions of the element isolation layers 4. As a result, electrical signal generated in the pd-A affects the pd-AU and the pd-AB, and thus crosstalk is occurred between adjacent pixel units.

One known solution to solve the above shortcoming is to inject impurities into a portion that is located within the light sensing region and having a predetermined distance from the element isolation layers 4 to form a photodiode therein. However, such a solution also has limits due to a decrease in photodiode region within the light sensing region and a gradual high integration of a semiconductor device.

DETAILED DESCRIPTION

Figure 1:
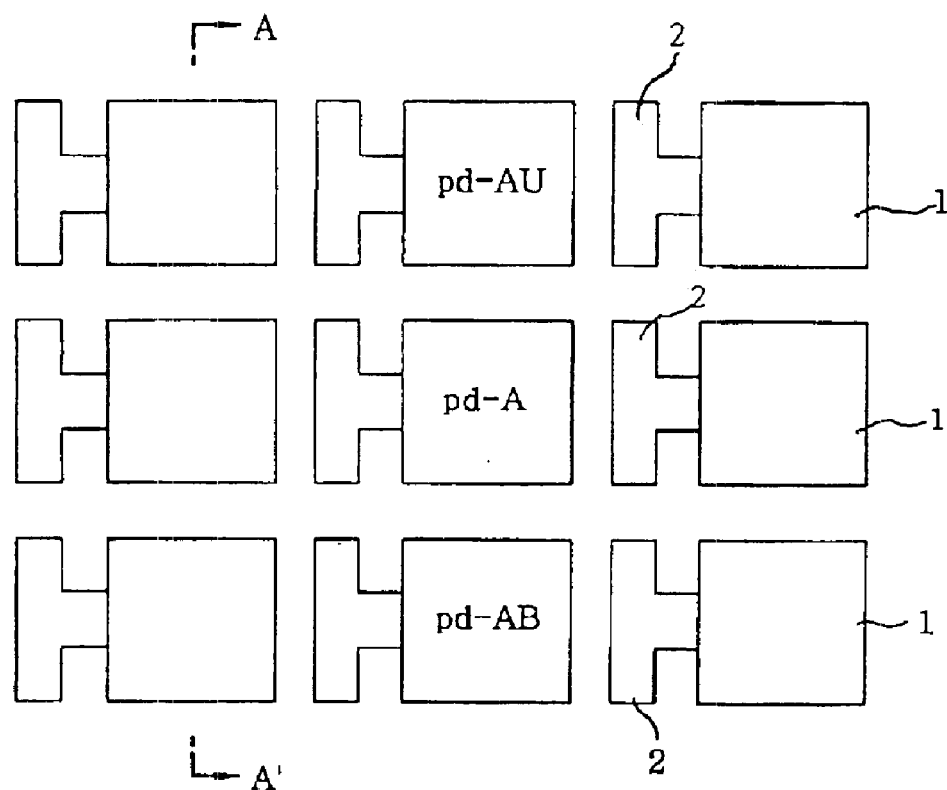
FIG. 1 shows a plan view for illustrating a pixel unit of a known CMOS image sensor.
Figure 2:
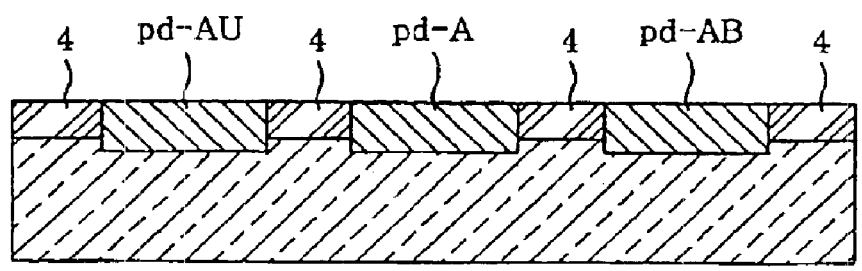
FIG. 2 describes a cross-sectional view taken along A–A' of FIG. 1.
Figure 3:
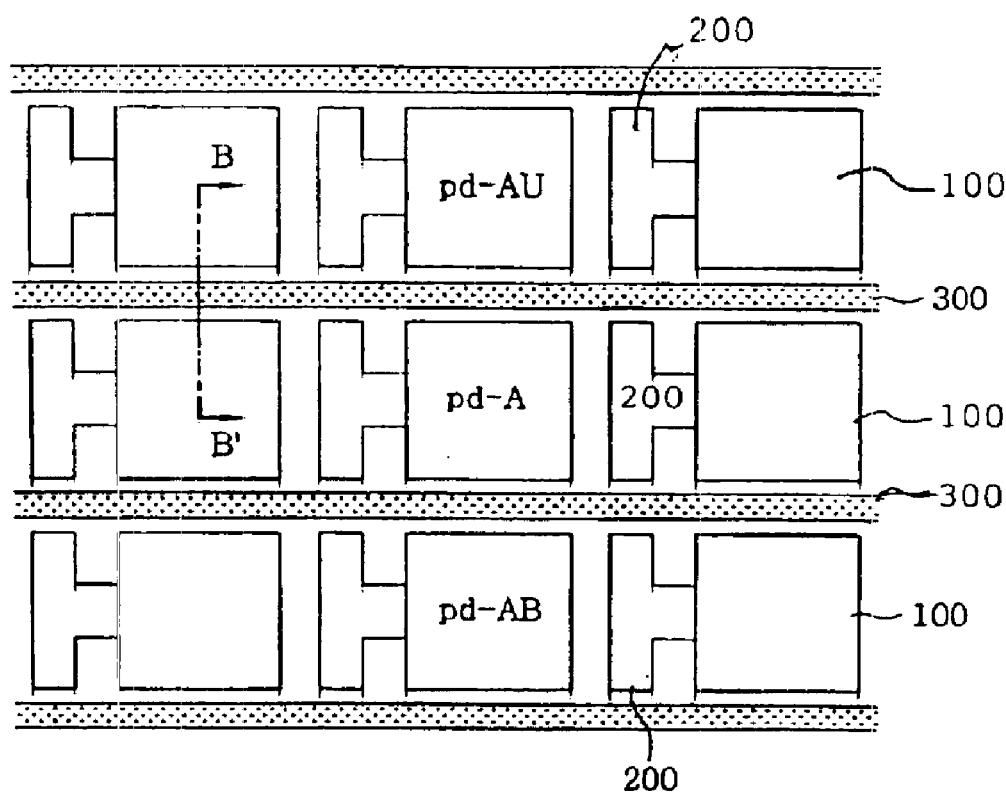
FIG. 3 depicts a plan view of an example a pixel unit of a CMOS image sensor.

As shown in FIG. 3, an example CMOS image sensor includes a pixel unit pd-A and upper and lower pixel units pd-AU and pd-AB, respectively. Each pixel unit pd-A, pd-AU and pd-AB includes the light sensing region 100, which may be implemented by a photodiode, configured to convert incident light into electrical signals and an active region 200 configured to manage or externally transmit the electrical signals generated in the light sensing region 100.

As shown in FIG. 3, the CMOS image sensor further includes protection regions 300 disposed between the pixel units pd-A, pd-AU and pd-AB. The protection regions 300 prevent or reduce crosstalk between the pixel unit exposed to incident light (e.g., pd-A) and the upper and the lower pixel units (pd-AU and pd-AB) thereof. Additionally, the protection regions 300 may decrease an attenuation of electrical signals generated by the photodiode (e.g., pd-A) due to remaining holes not moving to a semiconductor substrate.

Figure 4:
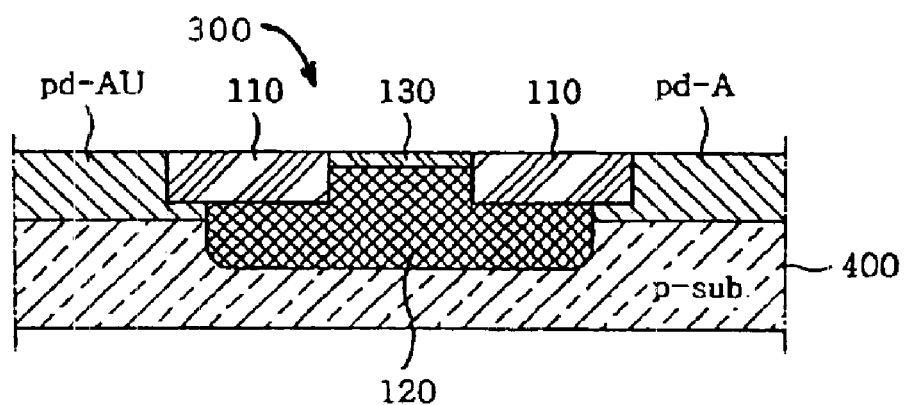
FIG. 4 provides a cross-sectional view taken along B–B' of FIG. 3.

FIG. 4 provides a cross-sectional view of the example CMOS image sensor taken along B–B' of FIG. 3. In one example that is shown in FIG. 4, the protection region 300 includes a well 120 and a junction 130 formed between element isolation layers 110. The well 120 and the junction 130 prevent the crosstalk generated when electrical signals generated in the pixel element pd-A flow into the pixel elements pd-AU and pd-AB through bottom portions of element isolation layers 110 by forming a barrier therebetween.

In one example, the pixel elements pd-A and pd-AU are doped with N-type impurities and the well 120 of the protection region 300 is a P-type material that is formed between the pixel elements pd-A and pd-AU by an ion implantation process. In such an arrangement, the junction 130 may be an n+ junction that is formed between the element isolation layers 110 so as to eliminate or reduce the occurrence of crosstalk. Further details pertinent to the prevention of crosstalk are provided below.

When the light sensing region 100 in each pixel element (e.g., the pixel element pd-A) is reset by an external power source (not shown), a depletion layer is generated at a PN junction in the light sensing region 100. The incidence of light on the pixel element causes electron-hole pairs (EHPs) to form in the depletion layer so that electrical signals are generated. The holes of EHPs then flow out through a semiconductor substrate 400, and a potential difference in the PN diode of the photodiode is generated by the remaining electrons of EHPs. This results in the CMOS sensor obtaining the electrical signals capable of representing an image using the potential difference.

Previously, if the amount of electrons generated in the pixel element (e.g., pd-A) were excessive, the electrons could flow into neighboring pixel elements to thereby disturb electrical signals of the neighboring pixel elements, thereby causing crosstalk. As disclosed herein, to avoid the occurrence of crosstalk, the junction 130, which may be formed from an n+ material, is formed in a path where the electrons flow into the neighboring pixel units and a positive voltage is applied to the junction 130 to prohibit the flow of electrons through the junction 130.

In another example, rather than the junction 130 being formed from n+ material, the junction 130 may be formed from p+ material. In such a case, it is possible to prevent a decrease in electrical signals due to remaining holes of EHPs not moving to the semiconductor substrate 400 to thereby improve output signals. In particular, the remaining holes not used to generate electrical signals are recombined with electrons of EHPs in a pixel element, so that the electrical signals are decreased. To remove such remaining holes, if a zero voltage or a negative voltage is applied to the p+ junction, the well 120 picks up remaining holes, thereby preventing a decrease in the electrical signals.

According to a further example, the well 120 can be formed from an N-type material instead of a P-type material. Further, a junction 130 of n+ material may be formed at the protection region 300 and a positive voltage may be applied to the junction 130 of n+ material. In this case, because the pixel unit is doped with N-type impurities, the N-well needs to be separated from the N-type impurities. After the N-well is formed as the protection region 300 between the element isolation layers 110, a junction 130 of p+ material is formed at the protection region 300. Then, in case carriers generated in a reference pixel unit (e.g., pa-A) are electrons, a positive voltage is applied to the p+ junction 130 to eliminate the electrons flowing into the upper and the lower pixel units (e.g., pa-AU or pa-AB).

Figure 5A:
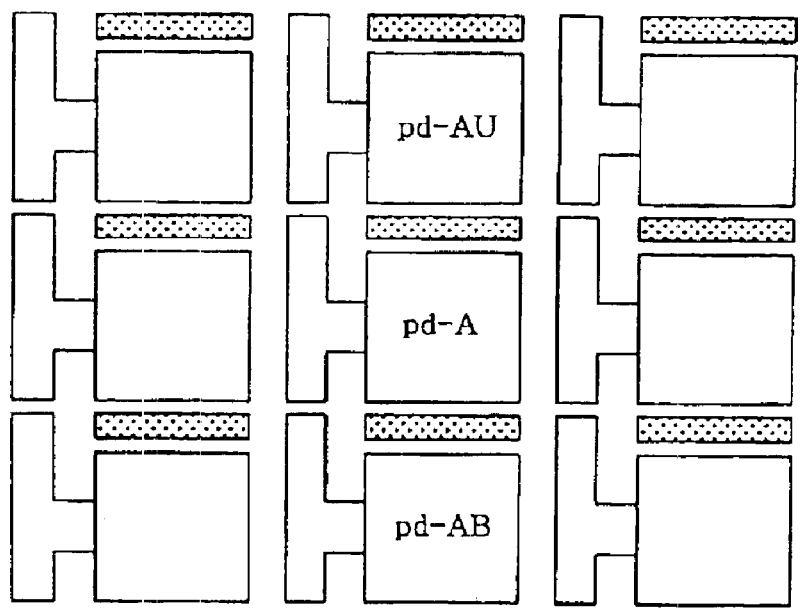
FIGS. 5A and 5B present plan views of an example CMOS image sensor.

As can be seen from FIG. 3, the disclosed CMOS image sensor includes protection regions 300 formed in a transverse direction to prevent crosstalk occurrence between neighboring pixel units. However, protection regions may be formed between the light sensing regions in each pixel unit, as illustrated in the example of FIG. 5A. Further, active regions may be formed so that a distance between active regions of pixel units is shorter than a distance between the light sensing regions therein.

Figure 5B:
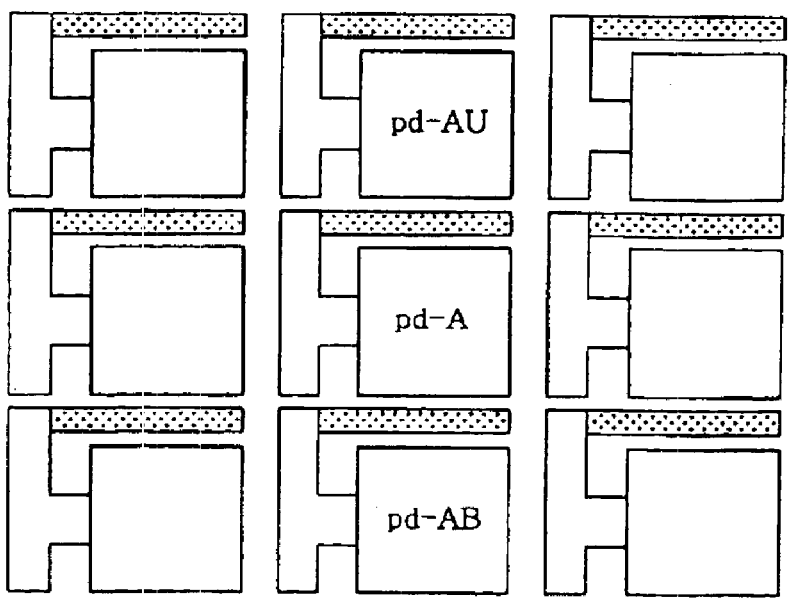

Still further, referring to the example of FIG. 5B, the protection region may be formed between the light sensing regions in each pixel units, wherein each protection region is coupled to each active region with same voltage applied thereto.

As described above, the disclosed CMOS image sensor includes protection regions that prevent carriers, which are generated during the conversion of incident light into electrical signals, from flowing into the upper and the lower pixel units. The pixel units are grouped in a transversal direction by the protection regions having a well and a junction so that the crosstalk between adjacent pixel units is decreased. Further, as disclosed herein it is possible to reduce the attenuation of the electrical signal due to the recombination of the electrons and the holes in each pixel unit.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A complimentary metal oxide semiconductor (CMOS) image sensor comprising:

a pixel unit having a light sensing region configured to convert incident light into an electrical signal and an active region for controlling the transfer of the electrical signal;

an element isolation layer adjacent the pixel unit; and a protection region adjacent the element isolation layer, the protection region including a well and a junction to prevent crosstalk generated by the pixel unit when incident light is converted to the electrical signal, wherein the well comprises a P-well and the junction comprises an n+ junction and wherein a positive voltage is applied to the n+ junction to eliminate electron flow into an adjacent pixel unit.

2. A complimentary metal oxide semiconductor (CMOS) image sensor comprising:

a pixel unit having a light sensing region configured to convert incident light into an electrical signal and an active region for controlling the transfer of the electrical signal;

an element isolation layer adjacent the pixel unit; and a protection region adjacent the element isolation layer, the protection region including a well and a junction to prevent crosstalk generated by the pixel unit when incident light is converted to the electrical signal, wherein the well comprises an N-well and the junction comprises a p+ junction and wherein a positive voltage is applied to the p+ junction to eliminate electron flow into an adjacent pixel unit.

3. A complimentary metal oxide semiconductor (CMOS) image sensor comprising:

a pixel unit having a light sensing region configured to convert incident light into an electrical signal and an active region for controlling the transfer of the electrical signal;

an element isolation layer adjacent the pixel unit; and a protection region adjacent the element isolation layer, the protection region including a well and a junction to prevent crosstalk generated by the pixel unit when incident light is converted to the electrical signal, wherein the well comprises an N-well and the junction comprises a p+ junction and wherein one of a negative voltage and a zero voltage is applied to the p+ junction to eliminate holes.

4. A complimentary metal oxide semiconductor (CMOS) image sensor comprising:

a pixel unit having a light sensing region configured to convert incident light into an electrical signal and an active region for controlling the transfer of the electrical signal;

an element isolation layer adjacent the pixel unit; and a protection region adjacent the element isolation layer, the protection region including a well and a junction to prevent crosstalk generated by the pixel unit when incident light is converted to the electrical signal, wherein the well comprises a P-well and the junction comprises a p+ junction and wherein one of a negative voltage and a zero voltage is applied to the p+ junction to eliminate holes.

* * * * *